United States Patent
Liu

(10) Patent No.: US 10,797,136 B2
(45) Date of Patent: Oct. 6, 2020

(54) MULTILAYER GRAPHENE QUANTUM CARBON-BASED SEMICONDUCTOR MATERIAL PREPARED FROM PI FILM, AND PREPARATION METHOD THEREFOR

(71) Applicant: SHENZHEN DANBOND TECHNOLOGY CO., LTD, Shenzhen, Guangdong (CN)

(72) Inventor: Ping Liu, Guangdong (CN)

(73) Assignee: SHENZHEN DANBOND TECHNOLOGY CO., LTD, Shenzhen, Guangdong (CN)

( * ) Notice: Subject to any disclaimer, the term of this patent is extended or adjusted under 35 U.S.C. 154(b) by 0 days.

(21) Appl. No.: 16/282,314

(22) Filed: Feb. 22, 2019

(65) Prior Publication Data

US 2019/0189754 A1 Jun. 20, 2019

Related U.S. Application Data

(63) Continuation of application No. PCT/CN2016/096271, filed on Aug. 22, 2016.

(51) Int. Cl.
| | |
|---|---|
| *H01L 29/16* | (2006.01) |
| *H01L 21/324* | (2006.01) |
| *H01L 29/167* | (2006.01) |
| *H01L 29/12* | (2006.01) |
| *C01B 32/182* | (2017.01) |
| *H01L 29/267* | (2006.01) |
| *H01L 23/532* | (2006.01) |

(52) U.S. Cl.
CPC ........ *H01L 29/1606* (2013.01); *C01B 32/182* (2017.08); *H01L 21/324* (2013.01); *H01L 23/53276* (2013.01); *H01L 29/12* (2013.01); *H01L 29/16* (2013.01); *H01L 29/167* (2013.01); *H01L 29/267* (2013.01)

(58) Field of Classification Search
CPC ..... H01L 29/1606; H01L 29/12; H01L 29/16; H01L 23/53276; C01B 32/182
See application file for complete search history.

(56) References Cited

U.S. PATENT DOCUMENTS

2014/0110665 A1* 4/2014 Zhang .................. H01L 51/502
257/13

FOREIGN PATENT DOCUMENTS

| CN | 101880039 | 11/2010 |
|---|---|---|
| CN | 104024146 | 9/2014 |
| CN | 104909357 | 9/2015 |
| CN | 105600782 | 5/2016 |
| JP | 2000178016 | 6/2000 |

OTHER PUBLICATIONS

Li et al., "Nitrogen-Doped Graphene Quantum Dots with Oxygen-Rich Functional Groups," Journal of the American Chemical Society, 2012, 134, pp. 15-18.*
Machine Translation of CN101880039.*
Liu et al., "Research Progress of Optical Modulator Based on Graphene-Metal Composite Structures", Laser and Optoelectronics Progress, School of Optoelectronics, Beijing Institute of Technology, Beijing 100081, China, Mar. 10, 2016.

* cited by examiner

*Primary Examiner* — Julia Slutsker
(74) *Attorney, Agent, or Firm* — Winston Hsu

(57) ABSTRACT

A preparation method for a multilayer graphene quantum carbon-based two-dimensional semiconductor material comprises: S1. taking a PI film as a raw material, and performing polymer sintering at a first temperature, to remove H, O and N atoms to form a carbon precursor; and S2. adjusting the temperature to a second temperature, and graphitizing the carbon precursor to form a multilayer graphene quantum carbon-based two-dimensional semiconductor material, wherein in at least the step S2, a nano metal material is doped to form quantum dots in the multilayer graphene. The multilayer graphene quantum carbon-based two-dimensional semiconductor material prepared by the method adopts a hexagonal planar net molecular structure, is orderly arranged, and has flexibility, high tortuosity, and quite low in-plane dispersity and degree of deviation. Band gaps are formed through doping of a nano metal, and the band gaps are controllable.

10 Claims, No Drawings

MULTILAYER GRAPHENE QUANTUM CARBON-BASED SEMICONDUCTOR MATERIAL PREPARED FROM PI FILM, AND PREPARATION METHOD THEREFOR

CROSS REFERENCE TO RELATED APPLICATIONS

This application is a continuation application of PCT/CN2016/096271 filed on 2016 Aug. 22. The contents of the above-mentioned application are all hereby incorporated by reference.

BACKGROUND OF THE INVENTION

1. Field of the Invention

The present invention relates to the technical field of graphene semiconductor materials, and particularly to a method for preparing a multilayer graphene quantum carbon-based two-dimensional semiconductor material.

2. Description of the Prior Art

Two-dimensional nano-carbon materials, especially graphene quantum carbon-based semiconductor materials, are attracting more and more attention. They have excellent electrical, optical, magnetic, thermal and mechanical properties and are ideal nanoelectronic and optical electronic materials. Graphene quantum carbon-based semiconductor materials have a special geometric structure, so that the electronic state near the Fermi surface is mainly extended Π state. Since there is no surface dangling bond, the scattering of the extended Π state by the surface defects of the nano-carbon structure hardly affects the transport of electrons in the materials, and the mobilities of electrons and holes in multi-layer graphene at normal temperature are extremely high, and are both greater than 100000 $cm^2 \cdot VS$, which exceeds the electron mobility of the most excellent silicon-based FETs. By controlling the structure of graphene of 1000 $cm^2 \cdot VS$, a semiconductor transistor can be obtained. In the case of a small bias voltage, the electron energy is insufficient to excite the optical phonon in the graphite, and has a weak interaction with the acoustic phonon in the graphene. The mean free path length can be as long as several micrometers, making the carrier exhibit perfect ballistic transport characteristics in a typical graphene device that is hundreds of centimeters long. The graphene-based electronic devices can have very good high-frequency response, the operating frequency of the transistors of ballistic transport is expected to exceed terahertz (THz), and the performances are superior to all known silicon-based semiconductor materials.

Due to its ultra-thin structure and excellent physical properties, graphene has demonstrated excellent performance and attractive application prospects in field effect transistors (TFTs). However, the band gap of graphene is zero, it means that a logic circuit cannot be fabricated therewith, which is the main difficulty and challenge of graphene encountered in application in devices such as transistors. Graphene is prepared from natural graphite by epitaxial growth, reduction of graphite oxide, peeling by CVD and then expanding by re-embedding, and organic synthesis. It is reported in literatures that the band gap created by the above methods is only 0.03 eV and the area is less than 1 inch, so these methods cannot be industrialized at all.

SUMMARY OF THE INVENTION

To solve the above problems, the present invention provides a method for preparing a multilayer graphene quantum carbon-based two-dimensional semiconductor material, with which a flexible multilayer graphene quantum carbon-based two-dimensional semiconductor material with controllable bandgap is formed and large-area, low-cost, high-volume and roll-to-roll continuous production is realized.

The present invention provides a method for preparing a multilayer graphene quantum carbon-based semiconductor material, which comprises the steps of S1. taking a polyimide film (PI film) as a raw material, and performing polymer sintering at a first temperature, to remove H, O and N atoms to form a microcrystalline carbon precursor, wherein the PI film is obtained by producing polyimide by hybridizing an aromatic diamine with an aromatic polyanhydride and introducing a methyl group, followed by cyclodehydration, polycondensation, and imidization; and the PI film is carbonized by the polymer sintering, to form an aromatic heterocyclic compound in a microcrystalline state with a large continuous region, and finally form a microcrystalline carbon precursor having an excellent artificial heterogeneous graphite structure; and S2. adjusting the temperature to a second temperature, and graphitizing the carbon precursor to form a multilayer graphene quantum carbon-based two-dimensional semiconductor material, wherein in at least the step S2, a nano metal material is doped to form quantum dots in the multilayer graphene.

Preferably, the first temperature comprises three stages, including a temperature for removing H atoms that is from 900 to 1100° C., a temperature for removing O atoms that is from 1800 to 2200° C., and a temperature for removing N atoms that is from 2700-3300° C.

Further preferably, the first temperature comprises three stages, including a temperature for removing H atoms that is 1000° C., a temperature for removing O atoms that is 2000° C., and a temperature for removing N atoms that is 3000° C.

Preferably, the second temperature is from 2000-3500° C.

Further preferably, the second temperature comprises two stages, including a first-stage temperature of 2000-2500° C. and a second-stage temperature of 2500-3500° C.

Preferably, the doped nano metal material comprises at least one of calcium (Ca), antimony (Sb), niobium (Nb), niobium (Y), molybdenum (Mo), silicon (Si), arsenic (As), indium (In), hafnium (Hf), and gallium (Ga) or an alloy of at least two thereof; and the particle size of the nano metal material is from 2 to 5 nm.

Further preferably, the doped nano metal material is InAs, and a multilayer graphene quantum carbon-based two-dimensional semiconductor material having InAs quantum dots is formed.

The present invention also provides a multilayer graphene quantum carbon-based two-dimensional semiconductor material, which is prepared by the method above.

BENEFICIAL EFFECTS OF THE PRESENT INVENTION

Through the carbonization and graphitization of the PI film, a flexible graphene structure that has, a hexagonal planar net molecular structure, is orderly arranged, and has high tortuosity, and quite low in-plane dispersity and degree of deviation. By the doping of the nano metal material, quantum dots are formed to realize the creation and regulation of the band gap. The preparation method can also satisfy large-area, low-cost, high-volume, and roll-to-roll continuous production.

The multilayer graphene quantum carbon-based two-dimensional semiconductor material prepared by the method can be used to prepare high-performance field effect transistors, quantum computing chip and other semiconductor material.

These and other objectives of the present invention will no doubt become obvious to those of ordinary skill in the art after reading the following detailed description of the preferred embodiment.

DETAILED DESCRIPTION

The present invention is described in further detail below with reference to embodiments.

Embodiments of the present invention are described in detail below. It is to be understood that the following description is merely illustrative, and is not intended to limit the scope of the present invention.

In an embodiment, the present invention provides a method for preparing a multilayer graphene quantum carbon-based two-dimensional semiconductor material. The preparation method comprises the steps of: S1. taking a PI film as a raw material, and performing polymer sintering at a first temperature, to remove H, O and N atoms to form a microcrystalline carbon precursor; and S2. adjusting the temperature to a second temperature, and graphitizing the carbon precursor to form a multilayer graphene quantum carbon-based two-dimensional semiconductor material, wherein in at least the step S2, a nano metal material is doped to form quantum dots in the multilayer graphene.

In a preferred embodiment, the PI film used is a transparent polyimide film prepared according to the prior art CN103289402A. The PI film is obtained by producing a polyimide by hybridizing an aromatic diamine with an aromatic polyanhydride and introducing a methyl group, followed by cyclodehydration, polycondensation, and imidization. The film has excellent orientation and high birefringence. Upon carbonization and graphitization, the thickness expansion of the face becomes small, and the variation in the length in the face direction is small. Therefore, the orientation disorder is reduced, the linear orientation is improved, and the strength is also improved. The film is not easy to crack, can be heated arbitrarily, and can be pressurized without damage.

The PI film is carbonized by polymer sintering to remove H, O, and N atoms, so that the heat treatment of the polymer is close to the temperature of single crystal graphite, and the C atoms are rearranged to form an aromatic heterocyclic compound in a microcrystalline state with a large continuous region, and finally form a microcrystalline carbon precursor having an excellent artificial heterogeneous graphite structure that achieves planar characteristics. The carbon precursor is graphitized and then the carbon structure is reorganized. The carbon atoms at the microcrystalline edge have accelerated and exacerbated motions at high temperature, and the microcrystals bond to each other to form macromolecules. A hexagonal mesh structure is created and aligned to form a crystal. A hexagonal carbon network layer is formed and grows gradually from one axis to two axes, to form a bendable flexible graphene structure having tortuosity, and quite low in-plane dispersity and degree of deviation.

In a preferred embodiment, during the carbonization by polymer sintering, the temperature for removing H atoms is from 900 to 1100° C., the temperature for removing O atoms is from 1800 to 2200° C., and the temperature for removing N atoms is from 2700 to 3300° C.

In a further preferred embodiment, during the carbonization by polymer sintering, the temperature for removing H atoms is 1000° C., the temperature for removing O atoms is from 2000° C., and the temperature for removing N atoms is 3000° C.

In a preferred embodiment, the temperature for graphitization is from 2000 to 3500° C.

In a further preferred embodiment, the graphitization comprises two stages, the reaction temperature in a first stage is 2000-2500° C. and the reaction temperature in a second stage is 2500-3500° C.

In a further preferred embodiment, the graphitization is carried out under $1.4 \times 10^{-8}$-$1.8 \times 10^{-8}$ mm Hg, and preferably $1.6 \times 10^{-8}$ mm Hg.

The highest peak G of the crystal structure formed after the PI film is carbonized and graphitized is located on the right side of 1582.6 cm$^{-1}$; the second peak has a 2D doublet structure, and is located at 2719.8 cm$^{-1}$; and the peak D at 1363 cm$^{-1}$ on the right side of the peak G is small; and the structural defects are few. The multi-layer graphene is a two-dimensional crystal, in which the atoms assume a planar hexagonal lattice pattern in which the hexagonal structure is arranged orderly, each carbon atom is joined to three carbon atoms. One of the four shell electrons chemically bonded is in a free moving state, and free electrons can move along the crystal lattice. Therefore, graphene has a high conductivity in the plane direction.

In both processes of carbonization and graphitization, a nano metal material is doped to form quantum dots, and thus a two-dimensional multilayer graphene quantum carbon-based material is prepared to realize the creation and regulation of band gap of graphene. The nano-transition metal is covalently bonded to graphene. When the electron cloud overlaps, a conjugated system (delocalized Π bond) is formed. The electron pairs are shared between the two atoms. The electrons cross over the nano barrier to form the Fermi sea of electrons. Electrons travel over a quantum barrier from a quantum well into another quantum well, forming a quantum tunneling effect, structural effect, and quantum confinement effect.

In a preferred embodiment, the doped nano metal material comprises at least one of Ca, Sb, Nb, Y, Mo, Si, As, In, Hf, and Ga or an alloy of at least two thereof.

In another preferred embodiment, the doped nano metal material is InAs, and a multilayer graphene quantum carbon-based two-dimensional semiconductor material having InAs quantum dots is formed.

Example 1

In an inert gas, the PI film is carbonized by polymer sintering, during which H, O, and N atoms are removed respectively at 1000, 2000 and 3000° C., and C atoms are rearranged to form a carbon precursor. The carbon precursor is graphitized at 2800° C. under an inert gas atmosphere, and a hexagonal mesh structure is created to form a high-purity single crystal graphene structure. The two-dimensional carbon layer is hexagonally densely packed, and had a planar network of molecules arranged orderly. In the carbonization and graphitization processes, the InAs nano metal material is doped to form quantum dots, and a multi-layer graphene quantum carbon-based two-dimensional semiconductor material is thus obtained. The quantum dot density is $1\times10^{10}$-$3\times10^{10}$ cm$^{-2}$, and the band gap width is 1.3-1.4 ev.

Example 2

The difference from Example 1 is that the doped nano metal material is a mixture of InAs and Sb, and the formed quantum dot density is $1.2\times10^{12}$ cm$^{-2}$. Through the quantum tunneling effect, the Sb element added to the InAs is adjusted to form the InSb$_x$As$_{1-x}$ quantum dots. The band gap width can be adjusted by adjusting the content x.

Comparative Example 1

The difference from Examples 1 and 2 is that the PI film is carbonized by polymer sintering, during which H, O, and N atoms are removed respectively at 500° C., 600° C., and 800° C. No multilayer graphene quantum carbon-based two-dimensional semiconductor material can be formed.

The foregoing content is further detailed descriptions made to the present invention with reference to specific/preferred implementations, and specific implementation of the present invention cannot be determined to be limited only to these descriptions. A person of ordinary skill in the art to which the present invention belongs may further make several replacements or modifications on the described implementations without departing from the conception of the present invention, and these replacement or modification manners should be considered to fall within the protection scope of the present invention.

What is claimed is:

1. A method for preparing a multilayer graphene quantum carbon-based two-dimensional semiconductor material, comprising steps of
step S1. taking a polyimide film as a raw material, and performing polymer sintering at a first temperature, to remove H, O and N atoms to form a microcrystalline carbon precursor, wherein the PI film is obtained by producing polyimide by mutually hybridizing an aromatic diamine with an aromatic polyanhydride and introducing a methyl group, followed by cyclodehydration, polycondensation, and imidization; and the polyimide film is carbonized by the polymer sintering, to form an aromatic heterocyclic compound in a microcrystalline state with a large continuous region, and finally form a microcrystalline carbon precursor having an artificial heterogeneous graphite structure; and
step S2. graphitizing the carbon precursor at a second temperature, to form a multilayer graphene quantum carbon-based two-dimensional semiconductor material, wherein after the graphitization, a bendable flexible graphene structure is formed,
wherein in at least the step S2, a nano metal material is doped to form quantum dots in the multilayer graphene.

2. The preparation method according to claim 1, wherein the first temperature comprises three stages, including a temperature for removing H atoms that is from 900 to 1100° C., a temperature for removing O atoms that is from 1800 to 2200° C., and a temperature for removing N atoms that is from 2700-3300° C.

3. The preparation method according to claim 2, wherein the first temperature comprises three stages, including a temperature for removing H atoms that is 1000° C., a temperature for removing 0 atoms that is 2000° C., and a temperature for removing N atoms that is 3000° C.

4. The preparation method according to claim 1, wherein the second temperature is 2000-3500° C.

5. The preparation method according to claim 4, wherein the second temperature comprises two stages, including a first-stage temperature of 2000-2500° C. and a second-stage temperature of 2500-3500° C.

6. The preparation method according to claim 1, wherein the nano metal material comprises at least one of Ca, Sb, Nb, Y, Mo, Si, As, In, Hf, and Ga, or an alloy of at least two thereof, and a particle size of the nano metal material is from 2 to 5 nm.

7. The preparation method according to claim 6, wherein the nano metal material is InAs, and a multilayer graphene quantum carbon-based two-dimensional semiconductor material having InAs quantum dots is formed.

8. The preparation method according to claim 1, wherein reactions of the steps S1 and S2 take place in a non-oxidizing environment.

9. The preparation method according to claim 1, wherein the multilayer graphene quantum carbon-based two-dimensional semiconductor material has 2 to 50 layers.

10. A multilayer graphene quantum carbon-based two-dimensional semiconductor material, prepared by the method according to claim 1.

* * * * *